(12) United States Patent
Park et al.

(10) Patent No.: US 9,735,331 B2
(45) Date of Patent: Aug. 15, 2017

(54) BONDING WIRE FOR SEMICONDUCTOR PACKAGE AND SEMICONDUCTOR PACKAGE INCLUDING SAME

(71) Applicant: SAMSUNG ELECTRONICS CO., LTD., Suwon-si (KR)

(72) Inventors: Soo Moon Park, Seoul (KR); Il Woo Park, Suwon-si (KR); Mi Hwa Yu, Suwon-si (KR); Chang Bun Yoon, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/238,282

(22) Filed: Aug. 16, 2016

(65) Prior Publication Data

US 2017/0148963 A1 May 25, 2017

(30) Foreign Application Priority Data

Nov. 19, 2015 (KR) ........................ 10-2015-0162535

(51) Int. Cl.
*H01L 33/62* (2010.01)
*H01L 23/00* (2006.01)
(Continued)

(52) U.S. Cl.
CPC ............ *H01L 33/62* (2013.01); *F21V 19/006* (2013.01); *F21V 23/02* (2013.01); *F21V 29/77* (2015.01); *G02B 6/0031* (2013.01); *G02B 6/0083* (2013.01); *H01L 24/45* (2013.01); *H01L 25/0753* (2013.01); *H01L 33/06* (2013.01);
(Continued)

(58) Field of Classification Search
CPC ......... H01L 33/62; H01L 24/45; H01L 33/06; H01L 33/145; H01L 33/32; H01L 33/42; H01L 33/46; H01L 33/54; H01L 33/502; F21V 29/77; F21V 23/02; F21V 19/006; H05B 37/0272; G02B 6/0083; G02B 6/0031

See application file for complete search history.

(56) References Cited

U.S. PATENT DOCUMENTS 6,261,436 B1 7/2001 Chang
6,372,608 B1 4/2002 Shimoda et al.
(Continued)

FOREIGN PATENT DOCUMENTS

JP 7-66235 A 3/1995

*Primary Examiner* — Roy Potter
*Assistant Examiner* — Paul Patton
(74) *Attorney, Agent, or Firm* — Sughrue Mion, PLLC

(57) ABSTRACT

Provided is a bonding wire for a semiconductor package and a semiconductor package including the same. The bonding wire for the semiconductor package may include a core portion including silver (Ag), and a shell layer surrounding the core portion, having a thickness of 2 nm to 23 nm, and including gold (Au). The semiconductor package may include a package body having a first electrode structure and a second electrode structure, a semiconductor light emitting device comprising a first electrode portion and a second electrode portion electrically connected to the first electrode structure and the second electrode structure, and a bonding wire connecting at least one of the first electrode structure and the second electrode structure to the semiconductor light emitting device.

17 Claims, 9 Drawing Sheets

(51) Int. Cl.
*H01L 33/06* (2010.01)
*H01L 33/14* (2010.01)
*H01L 33/32* (2010.01)
*H01L 33/42* (2010.01)
*H01L 33/46* (2010.01)
*H01L 33/54* (2010.01)
*H01L 33/50* (2010.01)
*H01L 25/075* (2006.01)
*H05B 37/02* (2006.01)
*F21V 8/00* (2006.01)
*F21V 23/02* (2006.01)
*F21V 19/00* (2006.01)
*F21V 29/77* (2015.01)

(52) U.S. Cl.
CPC .......... *H01L 33/145* (2013.01); *H01L 33/32* (2013.01); *H01L 33/42* (2013.01); *H01L 33/46* (2013.01); *H01L 33/502* (2013.01); *H01L 33/54* (2013.01); *H05B 37/0272* (2013.01); *H01L 2224/45139* (2013.01); *H01L 2224/45644* (2013.01); *H01L 2924/12041* (2013.01)

(56) References Cited

U.S. PATENT DOCUMENTS

| | | |
|---|---|---|
| 6,645,830 B2 | 11/2003 | Shimoda et al. |
| 6,696,756 B2 | 2/2004 | Chang |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,645,522 B2 | 1/2010 | Bischoff et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,812,358 B2 | 10/2010 | Yasuda |
| 7,940,350 B2 | 5/2011 | Jeong |
| 7,956,469 B2 | 6/2011 | Hayashi et al. |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,084,870 B2 * | 12/2011 | Lee .................. H01L 24/45 257/684 |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,940,403 B2 | 1/2015 | Lee et al. |
| 2003/0113574 A1 * | 6/2003 | Liao .................. B32B 15/018 428/607 |
| 2012/0043886 A1 | 2/2012 | Ji et al. |
| 2013/0011617 A1 | 1/2013 | Tasaki et al. |
| 2014/0048494 A1 | 2/2014 | Simmons, Jr. |

* cited by examiner

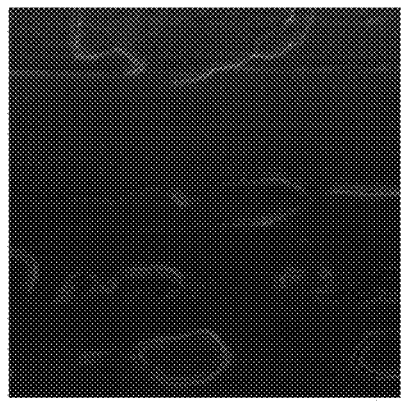
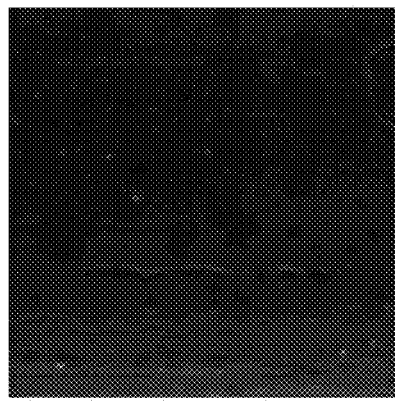
FIG. 3A  FIG. 3B
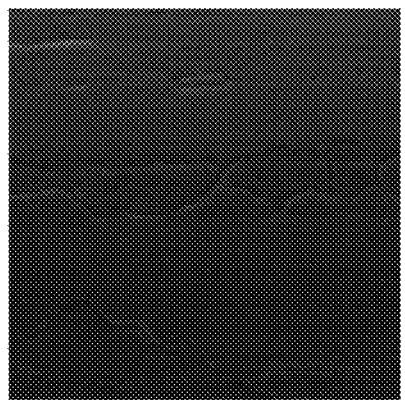
FIG. 3C  FIG. 3D
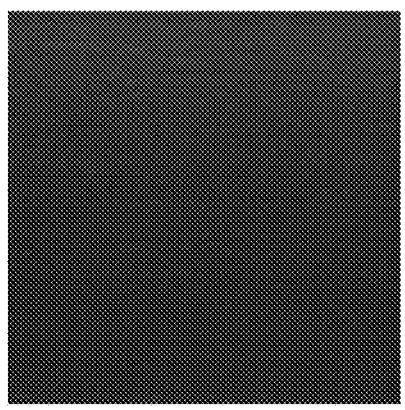
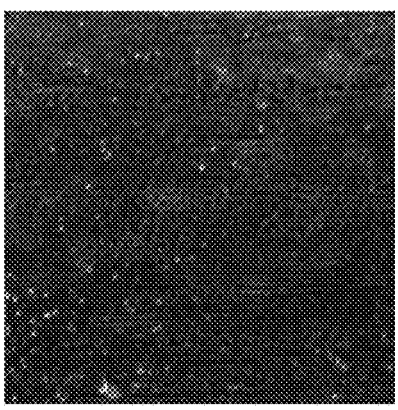
FIG. 3E  FIG. 3F

BONDING WIRE FOR SEMICONDUCTOR PACKAGE AND SEMICONDUCTOR PACKAGE INCLUDING SAME

CROSS-REFERENCE TO RELATED APPLICATION

This application claims the priority and benefit of Korean Patent Application No. 10-2015-0162535, filed on Nov. 19, 2015 in the Korean Intellectual Property Office, the disclosure of which is incorporated herein by reference in its entirety.

BACKGROUND

Apparatuses and methods consistent with example embodiments relate to a bonding wire for a semiconductor package and a semiconductor package including the same.

A bonding wire is used in a package process of electrically connecting an electrode of a semiconductor device to a lead frame of a board. Conventionally, gold (Au) having superior electrical conductivity, thermal conductivity, and chemical resistance has been used in a bonding wire.

In general, since Au is very expensive, manufacturing costs of a semiconductor package may be increased. Accordingly, development of a bonding wire in which a main inexpensive material such as silver (Ag) or copper (Cu) is used in order to replace a conventional bonding wire including Au as a raw material has recently increased.

However, while a bonding wire formed of Cu has excellent electrical conductivity, the surface of the bonding wire may be easily oxidized when exposed to air, causing a problem in bonding properties.

SUMMARY

Example embodiments provide a low-priced bonding wire for a semiconductor package that may replace a gold (Au) wire.

According to an example embodiment, there is provided a bonding wire for a semiconductor package, the bonding wire for a semiconductor package may include: a core portion including silver (Ag), and a shell layer surrounding the core portion, having a thickness of 23 nm or less, and including gold (Au).

According to another aspect of an example embodiment, there is provided a semiconductor package, the semiconductor package may include: a package body having a first electrode structure and a second electrode structure; a semiconductor light emitting device comprising a first electrode portion and a second electrode portion electrically connected to the first electrode structure and the second electrode structure; and a bonding wire connecting at least one of the first electrode structure and the second electrode structure to the semiconductor light emitting device, in which the bonding wire may include a core portion including silver (Ag), and a shell layer surrounding the core portion, having a thickness of 2 nm to 23 nm, and including gold (Au).

BRIEF DESCRIPTION OF DRAWINGS

The above and other aspects, features, and advantages of the example embodiments will be more clearly understood from the following detailed description taken in conjunction with the accompanying drawings, in which:

FIGS. 3A through 3F are scanning electron microscope (SEM) pictures of sulfur resistance test results according to an example embodiment and comparative examples, respectively;

DETAILED DESCRIPTION OF THE EXAMPLE EMBODIMENTS

Figure 1:
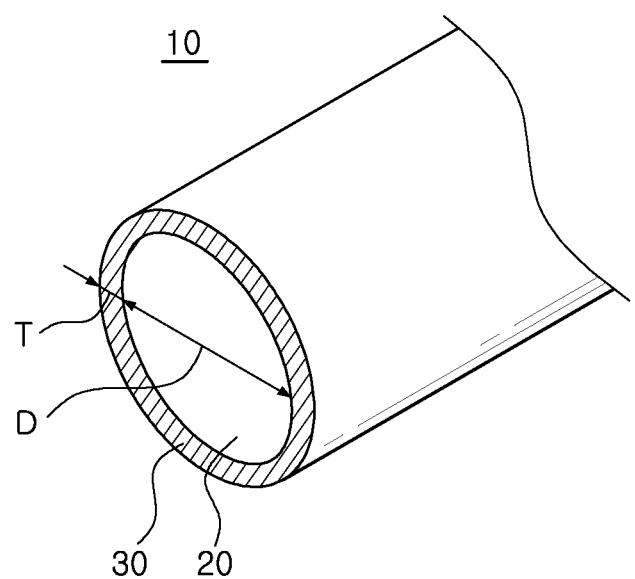
FIG. 1 is a schematic cross-sectional view of a bonding wire for a semiconductor package according to an example embodiment.

Hereinafter, various example embodiments will be described more fully with reference to the accompanying drawings.

The inventive concept may, however, be exemplified in many different forms and should not be construed as being limited to the specific example embodiments set forth herein. Rather, these example embodiments are provided so that this disclosure will be thorough and complete, and will fully convey the scope of the inventive concept to those skilled in the art.

It will be understood that when an element, such as a layer, region or wafer (substrate), is referred to as being "on," "connected to," or "coupled to" another element, it can be directly "on," "connected to," or "coupled to" the other element or intervening elements may be present. In contrast, when an element is referred to as being "directly on," "directly connected to," or "directly coupled to" another element, there are no intervening elements or layers present. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the inventive concept is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described with reference to schematic views illustrating example embodiments of the inventive concept. In the drawings, for example, due to manufacturing techniques and/or tolerances, modifications of the shape shown may be estimated. Thus, example embodiments should not be construed as being limited to the particular shapes of regions shown herein, for example, to include a change in shape results in manufacturing. The following example embodiments may also be constituted by one or a combination thereof.

The contents described below may have a variety of configurations and propose only a required configuration herein, but are not limited thereto.

FIG. 1 is a schematic cross-sectional view of a bonding wire for a semiconductor package according to an example embodiment.

Referring to FIG. 1, a bonding wire 10 according to an example embodiment may include a core portion 20 and a shell layer 30.

The core portion 20 may contain silver (Ag). For example, the core 20 may include Ag having a purity of 95% or more. A diameter D of the core portion 20 may range from about 10 μm to 50 μm, and for example, be 30.5 μm.

The shell layer 30 may contain gold (Au). For example, the shell layer 30 may include Au having a purity of 99% or more. A thickness T of the shell layer 30 may range from about 0.0065% to 0.075% of the diameter D of the core portion 20. For example, when the diameter D of the core portion 20 is 30.5 μm, the thickness T of the shell layer 30 may range from 2 nm to 23 nm.

The shell layer 30 may be formed by, for example, a plating method. The plating method may include electroplating and electroless plating. A method of forming the shell layer is not limited thereto, and may include a deposition method, a melting method, and the like known in the art.

The bonding wire 10 according to the example embodiment may include the core portion 20 including Ag, and the thin shell layer 30 containing Au, and thus manufacturing costs may be less than 20% of the manufacturing costs of a wire formed of Au having a diameter identical to that of the bonding wire 10.

Comparative Examples 1 through 3 and Examples 1 through 6 of the inventive concept will hereinafter be described.

Table 1 shows per-wavelength reflectivity and sulfur resistance test results according to Comparative Examples 1 through 3 and Examples 1 through 6.

Comparative Example 1 may correspond to a wire formed of Ag having a purity of 95%, Comparative Example 2 may correspond to an alloy wire including an alloy of 79 wt % of Ag and 21 wt % of Au, and Comparative Example 3 may correspond to a wire formed of Au having a purity of 99.99%. Example 1 may correspond to a bonding wire which includes a core portion including Ag having a purity of 95%, and a shell layer disposed on a surface of the core portion, including Au having a purity of 99% and having a thickness of 2 nm. Examples 2 through 6 may correspond to bonding wires each of which includes a shell layer disposed on the surface of the core portion and having a thickness of 10 nm, 15 nm, 20 nm, 25 nm, and 30 nm, respectively.

TABLE 1

|  |  | Per-wavelength reflectivity | | | | Sulfur resistance |
| --- | --- | --- | --- | --- | --- | --- |
|  |  | 420 nm | 430 nm | 440 nm | 450 nm | tance |
| Comparative Example 1 | Ag(95%) | 81.2 | 82.4 | 83.4 | 84.4 | — |
| Comparative Example 2 | 79 wt % Ag, 21 wt % Au | — | — | — | — | X |
| Comparative Example 3 | Au(99.99%) | 37.9 | 38.1 | 38.2 | 38.2 | ○ |
| Example 1 | Au 2 nm/Ag | — | — | — | — | ○ |
| Example 2 | Au 10 nm/Ag | 56.5 | 59.3 | 62.2 | 65.1 | ○ |
| Example 3 | Au 15 nm/Ag | 41.5 | 43.9 | 46.4 | 49.2 | ○ |
| Example 4 | Au 20 nm/Ag | 40.0 | 41.8 | 44.0 | 46.6 | ○ |
| Example 5 | Au 25 nm/Ag | 36.9 | 38.7 | 40.7 | 43.1 | ○ |
| Example 6 | Au 30 nm/Ag | 35.7 | 37.6 | 39.6 | 41.9 | ○ |

Referring to Table 1, Comparative Example 1 (i.e., 95% Ag) is measured to have a reflectivity of about 81% to 84% with regard to light having a wavelength of 420 nm to 450 nm. Comparative Example 3 (i.e., 99.99% Au) is measured to have a reflectivity of about 38% with regard to light having a wavelength of 420 nm to 450 nm. The reflectivity measurement results of Examples 2 through 6 show that when a thickness of the shell layer including Au and disposed on the surface of the core portion including Ag having a purity of 95% is increased, per-wavelength reflectivity (%) is decreased. Examples 2 through 6 are measured to have reflectivity higher than that of Comparative Example 3 with regard to light having a wavelength of 440 nm and 450 nm. Example 6 is measured to have reflectivity lower than that of Comparative Example 3 with regard to light having a wavelength of 430 nm. Examples 5 and 6 are measured to have reflectivity lower than that of Comparative Example 3 with regard to light having a wavelength of 420 nm.

Figure 2:
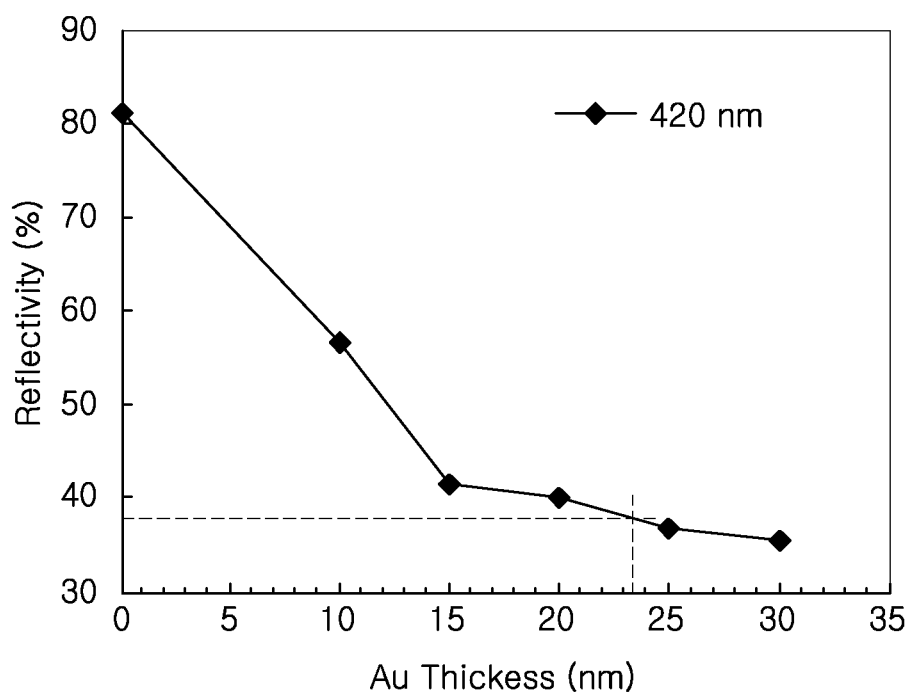
FIG. 2 is a diagram of reflectivity with regard to light having a wavelength of 420 nm according to example embodiments.

The reflectivity measurement results of Table 1 are shown in the graph of FIG. 2. FIG. 2 is a graph of reflectivity with regard to light having a wavelength of 420 nm according to example embodiments.

Reflectivity with regard to light having a wavelength of 420 nm is illustrated in FIG. 2 regarding Comparative Example 1 and Examples 2 through 6. FIG. 2 indicates a thickness of Au as 0 nm regarding Comparative Example 1.

Referring to FIG. 2, it can be seen that the shell layer is required to have a thickness of 23 nm or less in order to have reflectivity higher than that (e.g., about 38%) of Comparative Example 3 (i.e., 99.99% Au) with regard to light having the wavelength of 420 nm. There is no reflectivity measurement result regarding Example 1, but it can be inferred that Example 1 has reflectivity of about 76% based on the graph of FIG. 2.

Therefore, when the shell layer having a thickness of 23 nm and including Au is formed on the surface of the core portion including Ag, a bonding wire having reflectivity higher than that of a wire formed of Au may be obtained, with regard to light having a wavelength of 420 nm or more.

Ag may be combined with sulfur (S) present in the air in a process of manufacturing a semiconductor package or while used, thereby forming silver sulfide ($Ag_2S$), that is, a black crystal. Since such $Ag_2S$ is black in color, a surface of the bonding wire including Ag may be discolored to reduce surface reflectivity of the bonding wire. For example, a semiconductor package may cause a decrease in external light extraction efficiency when reflectivity of the bonding wire is reduced. Furthermore, when the bonding wire is heavily corroded by sulfur (S) components in the air, the semiconductor package may cause an electrical disconnection. Therefore, the bonding wire including Ag as a main component may be required to secure sulfur(S) resistance.

In Table 1, it shows that Comparative Example 2 is discolored in the sulfur resistance test. On the other hand, Comparative Example 3 and Examples 1 through 6 are not discolored in the sulfur resistance test. For example, by coating Au having a thickness of 2 nm, the sulfur resistance of the bonding wire including the core portion including Ag may be provided. For reference, in Table 1, Comparative Example 2 discolored after the sulfur resistance test is indicated as X, and Comparative Example 3 and Examples 1 through 6 not discolored thereafter are indicated as O.

FIGS. 3A through 3F are scanning electron microscope (SEM) pictures of sulfur resistance test results according to an example embodiment and comparative examples of the inventive concept, respectively. FIGS. 3A, 3C, and 3E are SEM pictures before the sulfur resistance test, and FIGS. 3B, 3D, and 3F are SEM pictures after the sulfur resistance test.

FIGS. 3A and 3B relate to Comparative Example 3 (i.e., the Au wire), FIGS. 3C and 3D relate to Example 1 (i.e., the coating Au having a thickness of 2 nm), and FIGS. 3E and 3F relate to Comparative Example 2 (the Ag alloy wire). Referring to FIGS. 3E and 3F regarding Comparative Example 2, a change in the surface of the bonding wire before and after the sulfur resistance test is definite. For example, the surface of the bonding wire is corroded due to the $Ag_2S$ formation. Unlike Comparative Example 2, Comparative Example 3 and Example 1 have no change in the surface of the bonding wire before/after the sulfur resistance test.

Therefore, when the shell layer is formed by coating Au having a thickness of 2 nm or more on the surface of the core portion including Ag, the same sulfur resistance as the Au wire may be obtained.

The above results show that when the shell layer, including Au having a purity of 99%, is formed on the surface of the core portion, including Ag having a purity of 95%, to have a thickness of 2 nm to 23 nm, a bonding wire having sulfur resistance and reflectivity with regard to light having a wavelength of 420 nm or more, higher than that of a wire formed of Au, may be obtained.

Figure 4:
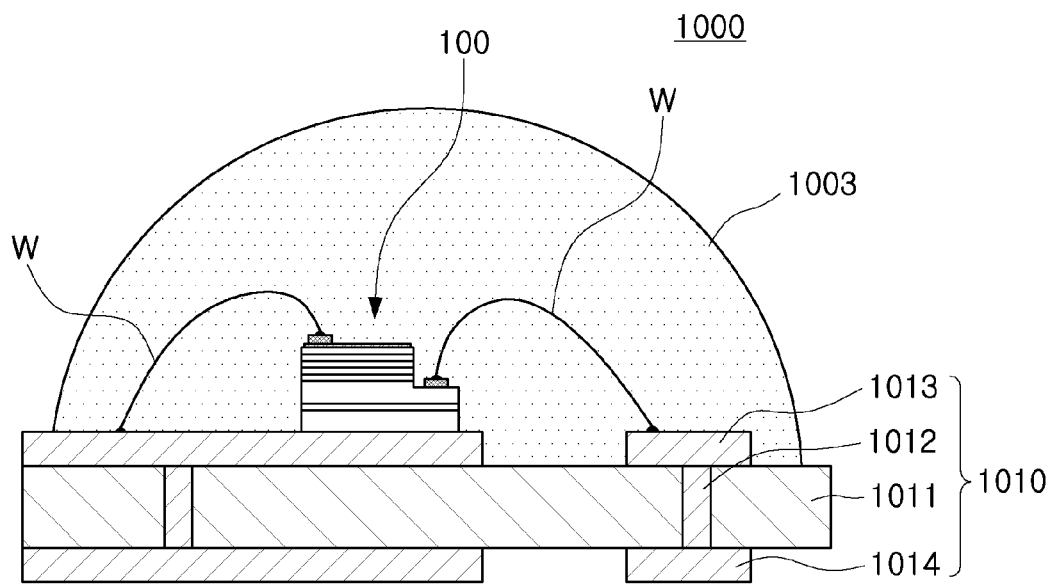
FIGS. 4 and 5 are cross-sectional views of semiconductor packages in which a bonding wire for a semiconductor package is employed according to an example embodiment, respectively.
Figure 5:
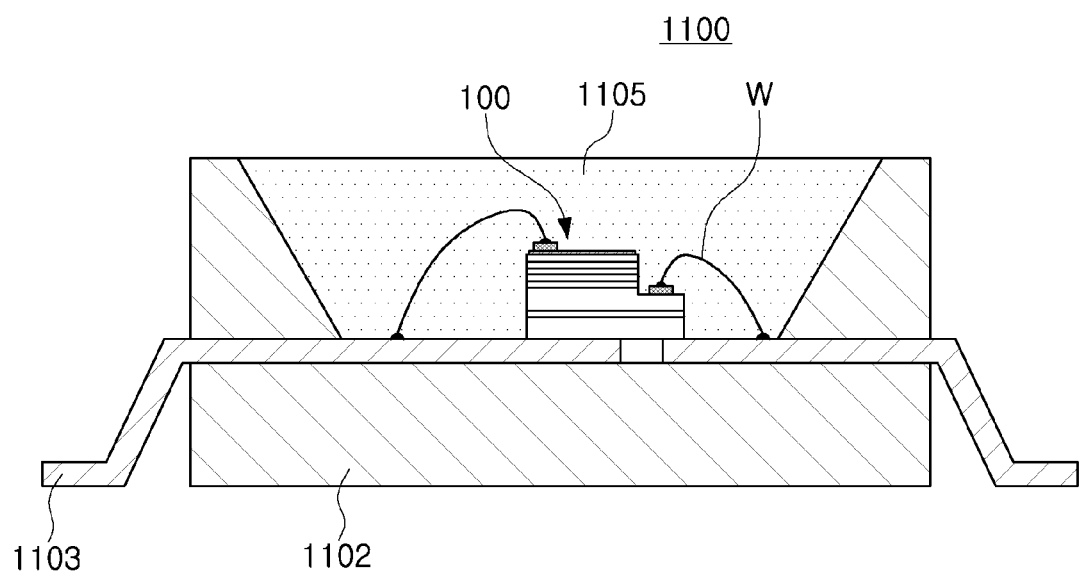

FIGS. 4 and 5 are cross-sectional views of semiconductor packages in which a bonding wire for a semiconductor package is employed according to an example embodiment, respectively.

A semiconductor package 1000 illustrated in FIG. 4 may include a semiconductor light emitting device 100, a board 1010, and an encapsulant 1003. The semiconductor light emitting device 100 may be mounted on the board 1010 to be electrically connected to the board 1010 through a wire W. The wire W may be the bonding wire according to an example embodiment as described above.

The board 1010 may include a board body 1011, an upper electrode 1013, a lower electrode 1014, and a through electrode 1012 connecting the upper electrode 1013 to the lower electrode 1014. The board body 1011 may be a resin, a ceramic, or a metal, and the upper or lower electrode 1013 or 1014 may be a metallic layer such as Au, Cu, Ag, or aluminum (Al). For example, the board 1010 may be provided as a substrate such as a printed circuit board (PCB), a metal core printed circuit board (MCPCB), a metal printed circuit board (MPCB), or a flexible printed circuit board (FPCB), and a structure of the board 1010 may be applied in various forms.

The encapsulant 1003 may have a dome-shaped lens structure having a convex upper surface, and according to an example embodiment, a surface of the encapsulant 1003 may have a convex or concave lens structure, thereby allowing an orientation angle of light emitted through an upper surface of the encapsulant 1003 to be adjusted.

Referring to FIG. 5, a semiconductor package 1100 may include the semiconductor light emitting device 100, a package body 1102, and a pair of lead frames 1103.

The semiconductor light emitting device 100 may be mounted on the pair of lead frames 1103, and respective electrodes of the semiconductor light emitting device 100 may be electrically connected to the pair of lead frames 1103 by a wire W. The wire W may be the bonding wire according to an example embodiment as described above.

The semiconductor light emitting device 100 may be disposed on a region different from that of the lead frames 1103, such as on the package body 1102. In addition, the package body 1102 may have a recess portion having a cup shape so that light reflection efficiency may be increased, and such a recess portion may be filled with an encapsulant 1105 including a light transmitting material to encapsulate the semiconductor light emitting device 100, the wire W, and the like.

The encapsulants 1103 and 1105 may contain a wavelength conversion material such as a phosphor and/or a quantum dot.

The phosphor may have the following empirical formulae and colors: yellow and green $Y_3Al_5O_{12}$:Ce, yellow and green $Tb_3Al_5O_{12}$:Ce, and yellow and green $Lu_3Al_5O_{12}$:Ce (oxide-based); yellow and green $(Ba,Sr)_2SiO_4$:Eu and yellow and orange $(Ba,Sr)_3SiO_5$:Ce (silicate-based); green β-SiAlON:Eu, yellow $La_3Si_6N_{11}$:Ce, orange α-SiAlON:Eu, red $CaAlSiN_3$:Eu, red $Sr_2Si_5N_8$:Eu, red $SrSiAl_4N_7$:Eu, red $SrLiAl_3N_4$:Eu, and red $Ln_{4-x}(Eu_zM_{1-z})_xSi_{12-y}Al_yO_{3+x+y}N_{18-x-y}$ (0.5≤x≤3, 0<z<0.3, 0<y≤4) (nitride-based), in which Ln may be at least one type of element selected from the group consisting of group IIIa elements and rare earth elements, and M may be at least one type of element selected from the group consisting of Calcium (Ca), Barium (Ba), Strontium (Sr) and Magnesium (Mg); and KSF-based red $K_2SiF_6$:$Mn^{4+}$, KSF-based red $K_2TiF_6$:$Mn^{4+}$, KSF-based red $NaYF_4$:$Mn^{4+}$, KSF-based red $NaGdF_4$:$Mn^{4+}$, and KSF-based red $K_3SiF_7$:$Mn^{4+}$ (fluoride-based).

A phosphor composition should basically conform with stoichiometry, and respective elements may be substituted with different elements in each groups on the periodic table. For example, Sr may be substituted with Ba, Ca, Mg, and the like of an alkaline earth (group II), and yttrium (Y) may be substituted with Terbium (Tb), Lutetium (Lu), Scandium (Sc), Gadolinium (Gd), and the like of lanthanides. In addition, Europium (Eu) or the like, an activator, may be substituted with Cerium (Ce), Tb, Praseodymium (Pr), Erbium (Er), Ytterbium (Yb), and the like according to required energy levels. An activator may be applied alone, or an additional sub-activator or the like may be additionally applied to modify characteristics.

In particular, a fluoride-based red phosphor may be coated with a fluoride not containing Mn, or may further include an organic coat on a surface of the fluoride-based red phosphor or on a surface of the fluoride-based red phosphor coated with a fluoride not containing Mn to improve reliability at high temperatures and high humidity. In the case of the fluoride-based red phosphor described above, since a narrow full width at half maximum (FWHM) less than or equal to 40 nm may be implemented unlike other phosphors, the fluoride-based red phosphor may be used for a high-resolution TV such as an ultra-high definition (UHD) TV.

Table 2 below indicates types of phosphors by application fields of white light emitting devices using a blue LED chip (about 440 nm to 460 nm) and an ultraviolet (UV) LED chip (about 380 nm to 430 nm).

TABLE 2

| Use | Phosphor |
| --- | --- |
| LED TV BACK LIGHT UNIT (BLU) | β-SiAlON:$Eu^{2+}$, (Ca, Sr)AlSiN$_3$:$Eu^{2+}$, $La_3Si_6N_{11}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Lighting | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |

TABLE 2-continued

| Use | Phosphor |
| --- | --- |
| Side View (Mobile, Laptop PC) | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, (Sr, Ba, Ca, Mg)$_2$SiO$_4$:$Eu^{2+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |
| Electronic device (Head Lamp, etc.) | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $K_3SiF_7$:$Mn^{4+}$ |

In addition, a wavelength conversion material such as a quantum dot (QD) may be used to replace a phosphor or to be mixed with a phosphor. The QD may have a core-shell structure using a group III-V compound semiconductor or a group II-VI compound semiconductor. For example, the QD may have a core such as CdSe or InP, and a shell such as ZnS or ZnSe. The QD may also include a ligand for stabilizing the core and the shell.

Figure 6:
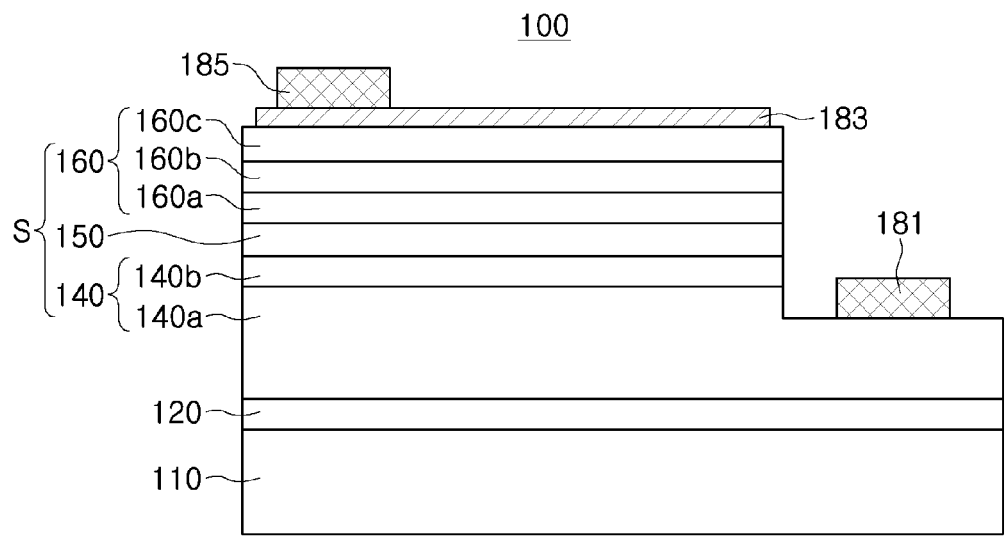
FIGS. 6 and 7 are cross-sectional views of semiconductor light emitting devices which may be employed in the semiconductor packages of FIGS. 4 and 5, respectively.

FIG. 6 is a cross-sectional view of a semiconductor light emitting device which may be employed in the semiconductor packages of FIGS. 4 and 5, respectively.

Referring to FIG. 6, the semiconductor light emitting device 100 may include a substrate 110, and a light emitting stack S including a first conductivity-type semiconductor layer 140, an active layer 150, and a second conductivity-type semiconductor layer 160 sequentially disposed on the substrate 110. A buffer layer 120 may be disposed between the substrate 110 and the first conductivity-type semiconductor layer 140.

The substrate 110 may be formed of an insulating material such as sapphire. The substrate 110 is not, however, limited thereto, and may be a conductive or a semi-conductive material, such as SiC, silicon (Si), $MgAl_2O_4$, MgO, $LiAlO_2$, $LiGaO_2$, or GaN.

The buffer layer 120 may have an empirical formula of $In_xAl_yGa_{1-x-y}N$ (0≤x≤1, 0≤y≤1), and may be, for example, GaN, AlN, AlGaN, or InGaN. The buffer layer 12 may be formed by combining a plurality of layers or gradually changing compositions thereof.

The first conductivity-type semiconductor layer 140 may be a nitride semiconductor layer satisfying n-type $In_xAl_yGa_{1-x-y}N$ (0≤x<1, 0≤y<1, 0≤x+y<1), and an n-type impurity may be silicon (Si). For example, the first conductivity-type semiconductor layer 140 may contain n-type GaN.

In the example embodiment, the first conductivity-type semiconductor layer 140 may include a first conductivity-type contact layer 140a and a current diffusion layer 140b. A concentration of an impurity contained in the first conductivity-type contact layer 140a may range from $2×10^{18}$ $cm^{-3}$ to $9×10^{19}$ $cm^{-3}$. A thickness of the first conductivity-type contact layer 140a may range from 1 μm to 5 μm. The current diffusion layer 140b may have a structure in which a plurality of $In_xAl_yGa_{1-x-y}N$ (0≤x, y≤1, 0≤x+y≤1) layers having different compositions or different impurity contents, respectively, are repeatedly stacked. For example, the current diffusion layer 140b may have an n-type GaN layer having a thickness of 1 nm to 500 nm and/or an n-type superlattice layer in which at least two layers having respective different compositions of $Al_xIn_yGa_zN$ (0≤x,y,z≤1, excluding x=y=z=0) are repeatedly stacked. A concentration of an impurity contained in the current diffusion layer 140b may range from $2\times10^{18}$ cm$^{-3}$ to $9\times10^{19}$ cm$^{-3}$. An additional insulating material layer may be applied to the current diffusion layer 140b.

The second conductivity-type semiconductor layer 160 may be a nitride semiconductor layer satisfying p-type In$_x$Al$_y$Ga$_{1-x-y}$N (0≤x<1, 0≤y<1, 0≤x+y<1), and a p-type impurity may be magnesium (Mg). For example, the second conductivity-type semiconductor layer 160 may be implemented as a single layer structure, but as in the example embodiment, may have a multilayer structure having different compositions. As illustrated in FIG. 6, the second conductivity-type semiconductor layer 160 may include an electron blocking layer (EBL) 160a, a low-concentration p-type GaN layer 160b, and a high-concentration p-type GaN layer 160c provided as a contact layer. For example, the EBL 160a may have a structure in which a plurality of layers having thicknesses of 5 nm to 100 nm and having different compositions of In$_x$Al$_y$Ga$_{1-x-y}$N (0≤x≤1, 0≤y≤1, 0≤x+y≤1), respectively, are stacked, or may have a single layer having a composition of Al$_y$Ga$_{1-y}$N (0<y≤1). For example, an amount of an Al composition of the EBL 160a may be reduced farther away from the active layer 150. An energy band gap of the EBL 160a may be decreased farther away from the active layer 150.

The active layer 150 disposed on the first conductivity-type semiconductor layer 140 may have a multiple quantum well (MQW) structure in which a plurality of quantum barrier layers and a plurality of quantum well layers are alternately stacked. For example, the quantum barrier layers and the quantum well layers may be In$_x$Al$_y$Ga$_{1-x-y}$N (0≤x≤1, 0≤y≤1, 0≤x+y≤1) having different compositions. In the example embodiment, the quantum well layers may be In$_x$Ga$_{1-x}$N (0<x≤1), and the quantum barrier layers may be GaN. Thicknesses of the quantum well layers and the quantum barrier layers may range from 1 nm to 50 nm, respectively.

The semiconductor light emitting device 100 may include a first electrode 181 disposed on a region of the first conductivity-type semiconductor layer 140, and an ohmic contact layer 183 and a second electrode 185 sequentially disposed on the second conductivity-type semiconductor layer 160.

The first electrode 181 may contain a material such as Ag, nickel (Ni), Al, chrome (Cr), rhodium (Rh), palladium (Pd), iridium (Ir), ruthenium (Ru), Mg, zinc (Zn), platinum (Pt), or Au, and may be employed as a structure having a single layer or two or more layers. The first electrode 181 may further include a pad electrode layer disposed thereon. The pad electrode layer may include at least one of materials such as Au, Ni, and tin (Sn).

The ohmic contact layer 183 may be implemented in various ways according to chip structures. For example, when the semiconductor light emitting device 100 has a flip chip structure, the ohmic contact layer 183 may contain a metal such as Ag, Au, and Al, or a transparent conductive oxide such as indium tin oxide (ITO), zinc indium oxide (ZIO), or gallium indium oxide (GIO). When the semiconductor light emitting device 100 has a structure disposed in an order opposite to that of the flip chip structure, the ohmic contact layer 183 may include a light emitting electrode. The light emitting electrode may be one of a transparent conductive oxide layer or a nitride layer. For example, the light emitting electrode may be at least one selected from ITO, zinc-doped indium tin oxide (ZITO), ZIO, GIO, zinc tin oxide (ZTO), fluorine-doped tin oxide (FTC)), aluminum-doped zinc oxide (AZO), gallium-doped zinc oxide (GZO), In$_4$Sn$_3$O$_{12}$, and zinc magnesium oxide (Zn$_{(1-x)}$Mg$_x$O) (0≤x≤1). The ohmic contact layer 183 may contain graphene. The second electrode 185 may contain at least one of Al, Au, Cr, Ni, titanium (Ti), and Sn.

Figure 7:
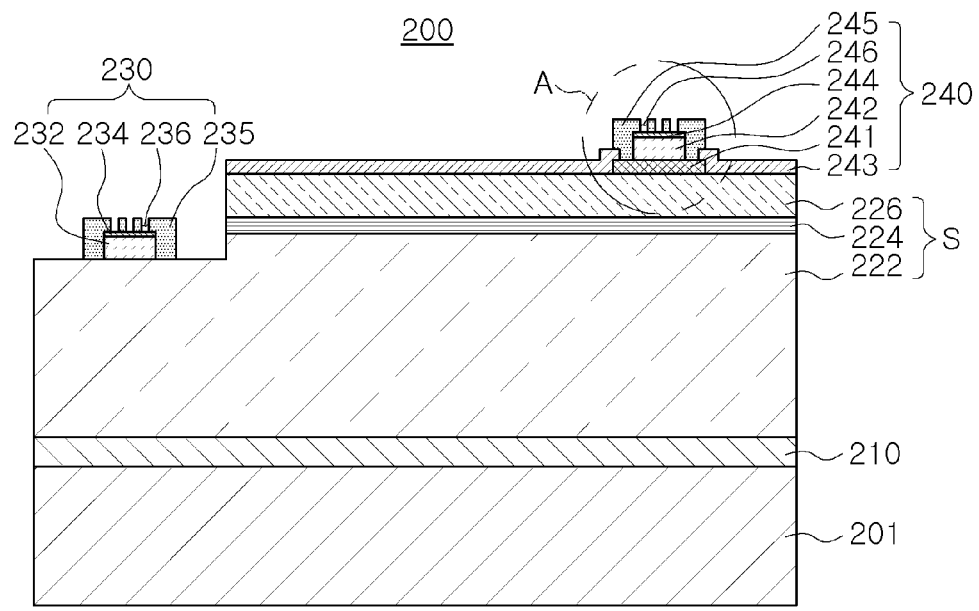
Figure 8:
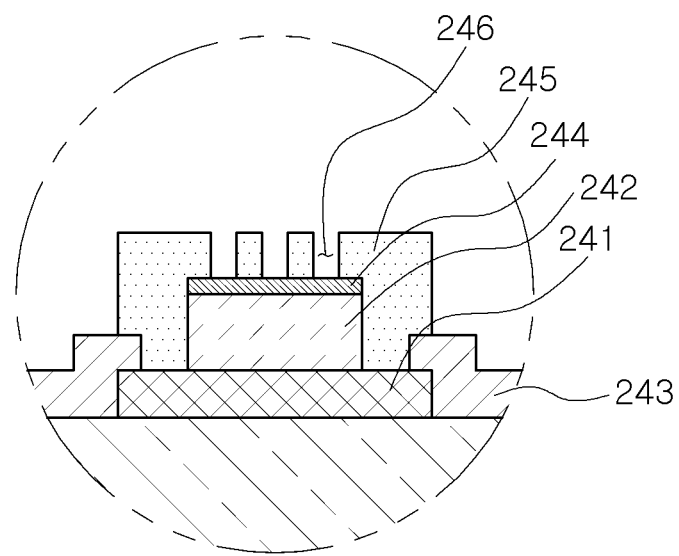
FIG. 8 is an expanded view of region A of FIG. 7.

FIG. 7 is a cross-sectional view of a semiconductor light emitting device which may be employed in the semiconductor packages of FIGS. 4 and 5. FIG. 8 is an expanded view of region A of FIG. 7.

Referring to FIG. 7, a semiconductor light emitting device 200 may include a light emitting stack S, a first electrode portion 230, and a second electrode portion 240 electrically connected to the light emitting stack S.

The light emitting stack S may be a semiconductor layer disposed on a substrate for semiconductor growth 201, and the substrate for semiconductor growth 201 may include a material such as sapphire, SiC, MgAl$_2$O$_4$, MgO, LiAlO$_2$, LiGaO$_2$, or GaN.

The light emitting stack S may include a first conductivity-type semiconductor layer 222, an active layer 224, and a second conductivity-type semiconductor layer 226, sequentially disposed on the substrate 201. The first and second conductivity-type semiconductor layers 222 and 226 may be n- and p-type semiconductor layers, respectively, and include nitride semiconductors, respectively. The first and second conductivity-type semiconductor layers 222 and 226 may have a composition of Al$_x$In$_y$Ga$_{(1-x-y)}$N (0≤x≤1, 0≤y≤1, 0≤x+y≤1) which corresponds to a material such as GaN, AlGaN, or InGaN. The active layer 224 may include an undoped nitride semiconductor layer having a single quantum well (SQW) structure or an MQW structure. The active layer 224 may have, for example, an MQW structure in which quantum barrier layers and quantum well layers, respectively having different compositions satisfying Al$_x$In$_y$Ga$_{(1-x-y)}$N (0≤x≤1, 0≤y≤1, 0≤x+y≤1), are alternately stacked on each other. The MQW structure may be formed by repeatedly stacking, for example, an InGaN/GaN pair structure. The first and second conductivity-type semiconductor layers 222 and 226 and the active layer 224 may be formed using a crystal growth process such as metal organic chemical vapor deposition (MOCVD), molecular beam epitaxy (MBE), or hydride phase vapor epitaxy (HVPE) known in the art.

A buffer layer 210 may be disposed between the substrate for semiconductor growth 201 and the light emitting stack S. When the light emitting stack S is grown on the substrate for semiconductor growth 201, for example, in a case in which a thin GaN film is grown as a light emitting stack on a heterogeneous substrate, a mismatch between lattice constants of the heterogeneous substrate and the thin GaN film may cause a lattice defect such as dislocation, and bending of the heterogeneous substrate caused by a difference between thermal expansion coefficients of the heterogeneous substrate and the thin GaN film may cause cracking of the light emitting stack S. For such defect and bending controls, the buffer layer 210 may be formed on the substrate for semiconductor growth 201, and then a light emitting stack S having a required structure, for example, a nitride semiconductor, may be grown on the buffer layer 210. The buffer layer 210 may be a low-temperature buffer layer formed at temperatures lower than single-crystal growth temperatures at which the light emitting stack S is formed, but is not limited thereto. Al$_x$In$_y$Ga$_{1-x-y}$N (0≤x≤1, 0≤y≤1), in particular, GaN, AlN, and AlGaN, may be used as a material forming the buffer layer 210. For example, the buffer layer 210 may be an undoped GaN layer doped with no impurities and having a certain thickness. However, the buffer layer 210 is not limited thereto, and any structure improving crystallinity of the light emitting stack S, for example, a material such as $ZrB_2$, $HfB_2$, ZrN, HfN, TiN, or ZnO may be used. The buffer layer 210 may also be formed by combining a plurality of layers with each other or gradually changing compositions thereof.

The first and second electrode portions 230 and 240 may be electrically connected to the first and second conductivity-type semiconductor layers 222 and 226, respectively, and contact the first and second conductivity-type semiconductor layers 222 and 226, respectively. The first and second electrode portions 230 and 240 may include bonding electrode layers 234 and 244 bonded to bonding wires, and unevenness electrode layers 235 and 245 having through holes 236 and 246 formed therein, respectively.

The bonding electrode layers 234 and 244 may be directly formed on the first and second conductivity-type semiconductor layers 222 and 226, but may further have reflectors 232 and 242 respectively disposed on lower portions of the bonding electrode layers 234 and 244. The reflectors 232 and 242 may reflect light emitted by the active layer 224 in order not to be absorbed by the first and second electrode portions 230 and 240. The reflectors 232 and 242 may be formed as one of Al, Ag, Pt, Rh, Ru, Ni, Pd, Ir, Mg, Zn and Au, that is, a high reflective metal. For example, Ti may be deposited on upper portions of the reflectors 232 and 242, and oxidation of the reflectors 232 and 242 may thus be prevented.

A current blocking layer 241 may further be formed below the reflector 242. The current blocking layer 241 may be formed of an insulating material such as $SiO_2$.

A transparent electrode layer 243 may be formed on the second conductivity-type semiconductor layer 226 to cover a region of the current blocking layer 241. As a current diffusion layer, the transparent electrode layer 243 may be formed on an upper surface of the second conductivity-type semiconductor layer 226. The transparent electrode layer 243 may include a transparent conductive oxide layer, or may contain at least one selected from the group consisting of ITO, ZITO, ZIO, GIO, ZTO, FTO, AZO, GZO, $In_4Sn_3O_{12}$ or $Zn_{(1-x)}Mg_xO$ ($0 \leq x \leq 1$).

The bonding electrode layers 234 and 244 may be formed on upper surfaces of the reflectors 232 and 242 to cover the upper surfaces and lateral regions of the reflectors 232 and 242, respectively. The bonding electrode layers 234 and 244 may contain the same material as a bonding wire. As such, when the bonding electrode layers 234 and 244 contain the same material as the bonding wire, a bond strength of an interface at which the bonding electrode layers 234 and 244 and the bonding wire are bonded to each other may be increased. In more detail, when a material forming the bonding electrode layers 234 and 244 contains 70% or more of the same material as the bonding wire, the bond strength of the interface may be improved.

The bonding electrode layers 234 and 244 may have the unevenness electrode layers 235 and 245 formed thereon, respectively. The unevenness electrode layers 235 and 245 may have at least one of the through holes 236 and 246 formed therein in a thickness direction of the unevenness electrode layers 235 and 245, and portions of the bonding electrode layers 234 and 244 may be exposed to lower surfaces of the through holes 236 and 246, respectively. Shapes of the through holes 236 and 246 may be circular when viewed from above. The through holes 236 and 246 may also be polygonal. For example, cross-sections of the through holes 236 and 246 may be circular or polygonal. The through holes 236 and 246 may have regular intervals and fixed sizes as in a lattice arrangement, but may be modified in various ways.

In some cases, the unevenness electrode layers 235 and 245 may be formed of a material including a composition different from that of the bonding electrode layers 234 and 244. The through holes 236 and 246 of the unevenness electrode layers 235 and 245 may correspond to regions to which the bonding wire is bonded to fill the through holes 236 and 246, and may allow the bonding electrode layers 234 and 244, respectively exposed to the lower surfaces of the through holes 236 and 246, to be directly bonded to the bonding wire. Therefore, the through holes 236 and 246 may be provided in the unevenness electrode layers 235 and 245, respectively, and in a case in which a bonding wire formed of a material different from that of the unevenness electrode layers 235 and 245 is bonded to the unevenness electrode layers 235 and 245, the bonding electrode layers 234 and 244 may be formed on lower portions of the unevenness electrode layers 235 and 245, respectively, thereby enabling a bond between the identical materials.

Figure 9:
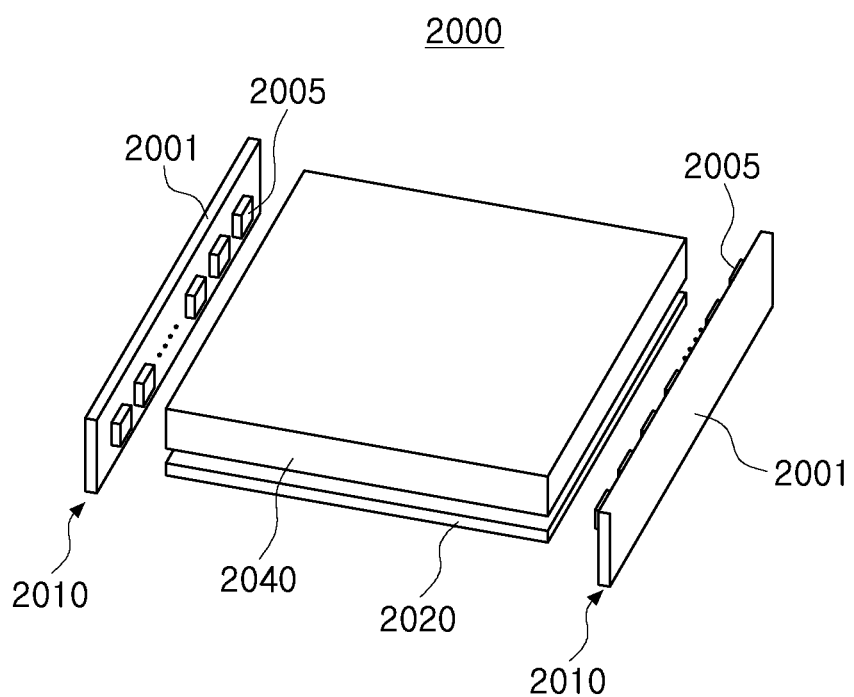
FIG. 9 is a perspective view of a backlight unit including a semiconductor package in which a bonding wire for a semiconductor package is employed according to an example embodiment.

FIG. 9 is a perspective view of a backlight unit including a semiconductor package in which a bonding wire for a semiconductor package is employed according to an example embodiment.

Referring to FIG. 9, a backlight unit 2000 may include a light guide plate 2040 and light source modules 2010 provided on opposing surfaces of the light guide plate 2040. The backlight unit 2000 may further include a reflector 2020 disposed below the light guide plate 2040. The backlight unit 2000 may be an edge type.

According to an example embodiment, the light source modules 2010 may be provided only on a side surface of the light guide plate 2040, or additionally on another side surface thereof. Each of the light source modules 2010 may include a PCB 2001 and a plurality of light sources 2005 disposed on an upper surface of the PCB 2001. Here, the light sources 2005 may be mounted on the PCB 2001 using the bonding wire for the semiconductor package according to an example embodiment.

Figure 10:
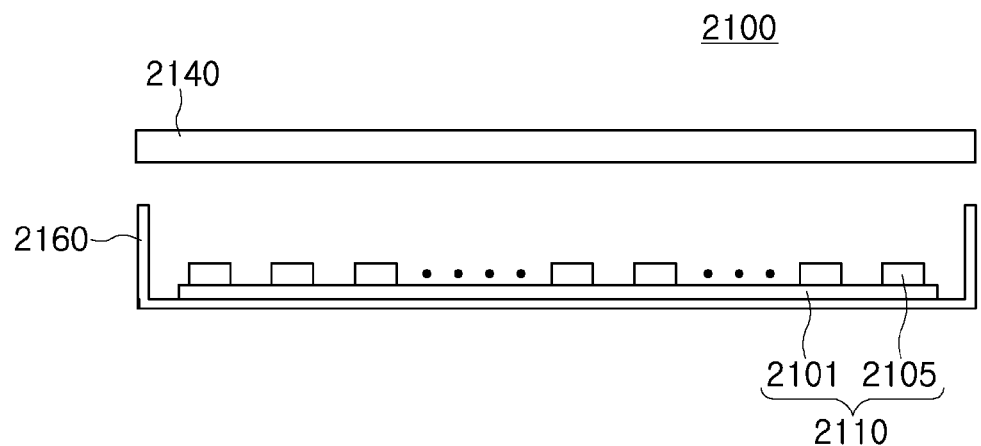
FIG. 10 is a cross-sectional view of a direct-type backlight unit including a semiconductor package in which a bonding wire for a semiconductor package is employed according to an example embodiment.

FIG. 10 is a cross-sectional view of a direct-type backlight unit including a semiconductor package in which a bonding wire for a semiconductor package is employed according to an example embodiment.

Referring to FIG. 10, a backlight unit 2100 may include a light diffusion plate 2140 and a light source module 2110 disposed below the light diffusion plate 2140. The backlight unit 2100 may further include a bottom case 2160 disposed below the light diffusion plate 2140 and accommodating the light source module 2110. The backlight unit 2100 may be a direct type.

The light source module 2110 may include a PCB 2101 and a plurality of light sources 2105 disposed on an upper surface of the PCB 2101. Here, the light sources 2105 may be mounted on the PCB 2101 using the bonding wire for the semiconductor package according to an example embodiment.

Figure 11:
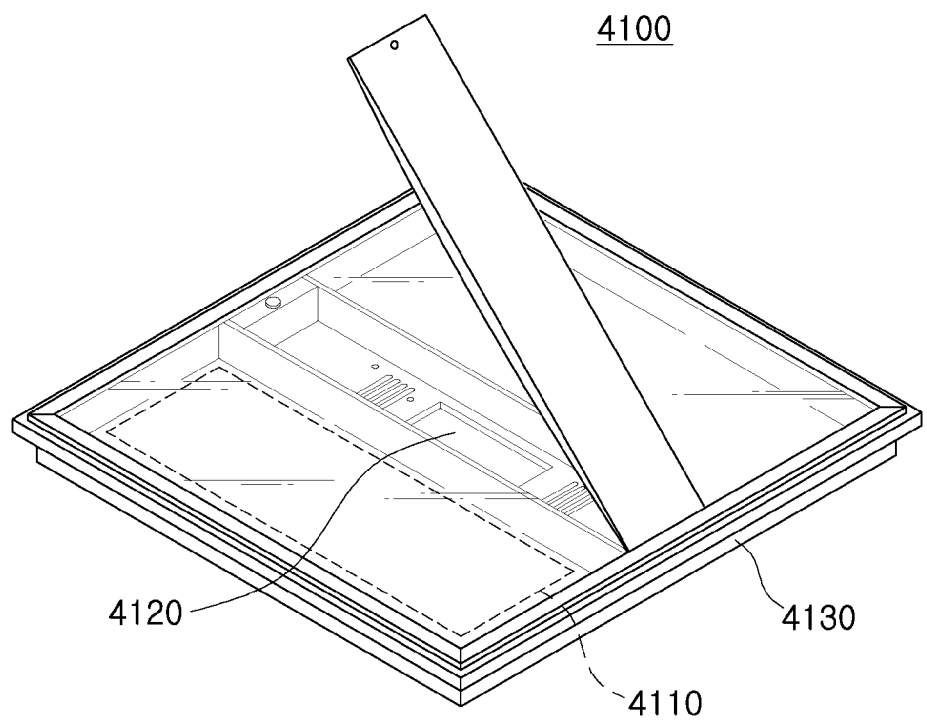
FIG. 11 is a perspective view of a flat lighting device including a semiconductor package in which a bonding wire for a semiconductor package is employed according to an example embodiment.

FIG. 11 is a perspective view of a flat lighting device including a semiconductor package in which a bonding wire for a semiconductor package is employed according to an example embodiment.

Referring to FIG. 11, a flat lighting device 4100 may include a light source module 4110, a power supply 4120, and a housing 4130. According to an example embodiment, the light source module 4110 may include a light emitting device array as a light source, and the power supply 4120 may include a light emitting device driver.

The light source module 4110 may include the light emitting device array, and have an overall flat shape. The light emitting device array may include a light emitting device and a controller storing driving information of the light emitting device. Here, the light source module 4110 may include the light emitting device mounted therein the bonding wire for the semiconductor package according to an example embodiment.

The power supply 4120 may be configured to supply power to the light source module 4110. The housing 4130 may have a space to receive the light source module 4110 and the power supply 4120 therein, and may have a hexahedral shape with an open side surface thereof, but is not limited thereto. The light source module 4110 may be disposed to emit light to the open side surface of the housing 4130.

Figure 12:
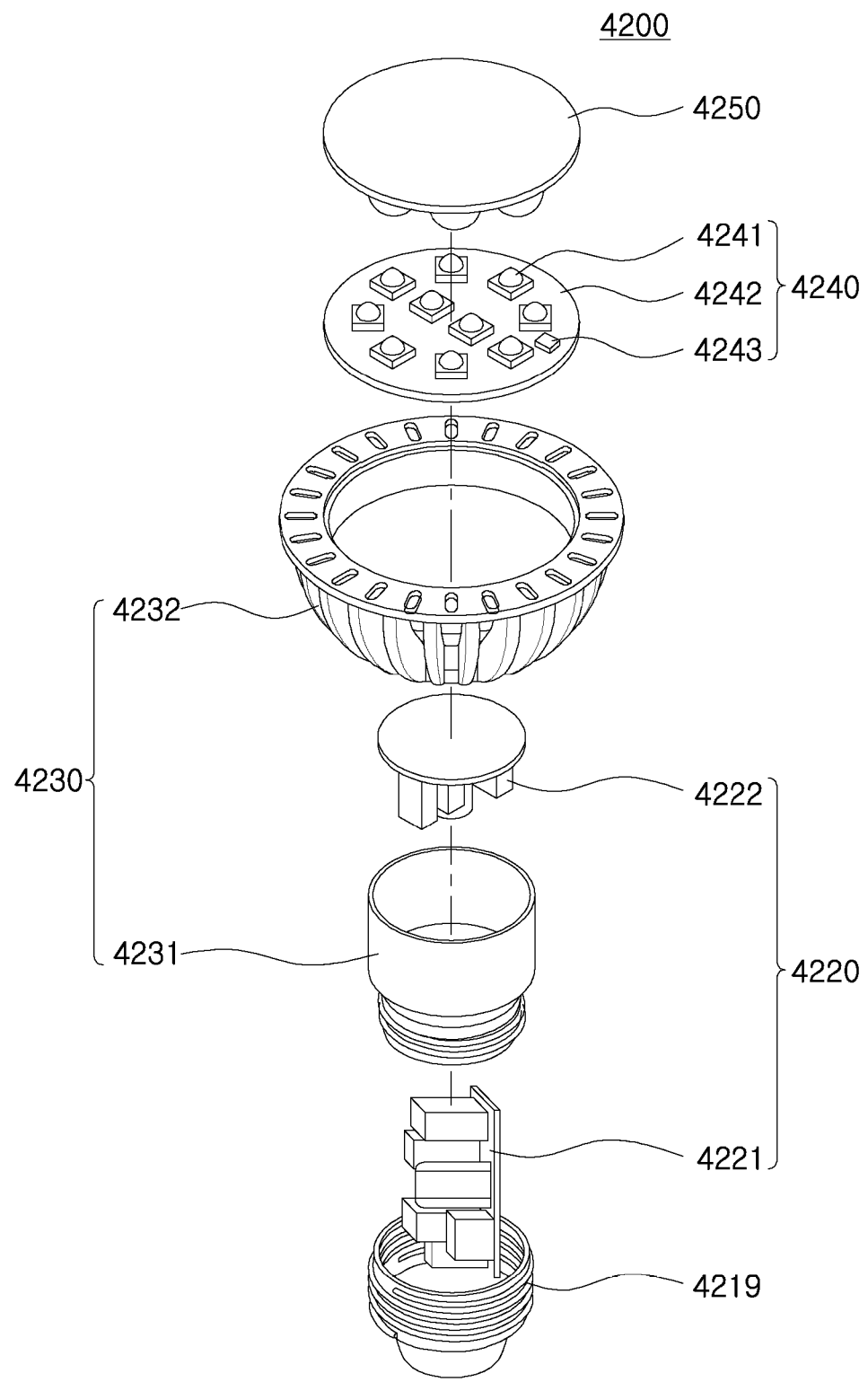
FIG. 12 is an exploded perspective view of a bulb-type lamp including a semiconductor package in which a bonding wire for a semiconductor package is employed according to an example embodiment.

FIG. 12 is an exploded perspective view of a bulb-type lamp including a semiconductor package in which a bonding wire for a semiconductor package is employed according to an example embodiment.

Referring to FIG. 12, a lighting device 4200 may include a socket 4219, a power supply 4220, a heat sink 4230, a light source module 4240, and an optical unit 4250. The light source module 4240 may include a light emitting device array, and the power supply 4220 may include a light emitting device driver.

The socket 4219 may be configured to replace that of a conventional lighting device. Power supplied to the lighting device 4200 may be applied through the socket 4219. As illustrated in FIG. 12, the power supply 4220 may be separately attached with a first power supply 4221 and a second power supply 4222. The heat sink 4230 may include an internal heat sink 4231 and an external heat sink 4232. The internal heat sink 4231 may be directly connected to the light source module 4240 and/or the power supply 4220. This may allow heat to be transferred to the external heat sink 4232. The optical unit 4250 may include an internal optical portion (not shown) and an external optical portion (not shown), and may be configured to evenly scatter light emitted by the light source module 4240.

The light source module 4240 may receive power from the power supply 4220 to emit light to the optical unit 4250. The light source module 4240 may include at least one light emitting device 4241, a circuit board 4242, and a controller 4243 which may store driving information of the at least one light emitting device 4241. Here, the light emitting device 4241 may be mounted on the circuit board 4242 using the bonding wire for the semiconductor package according to an example embodiment.

Figure 13:
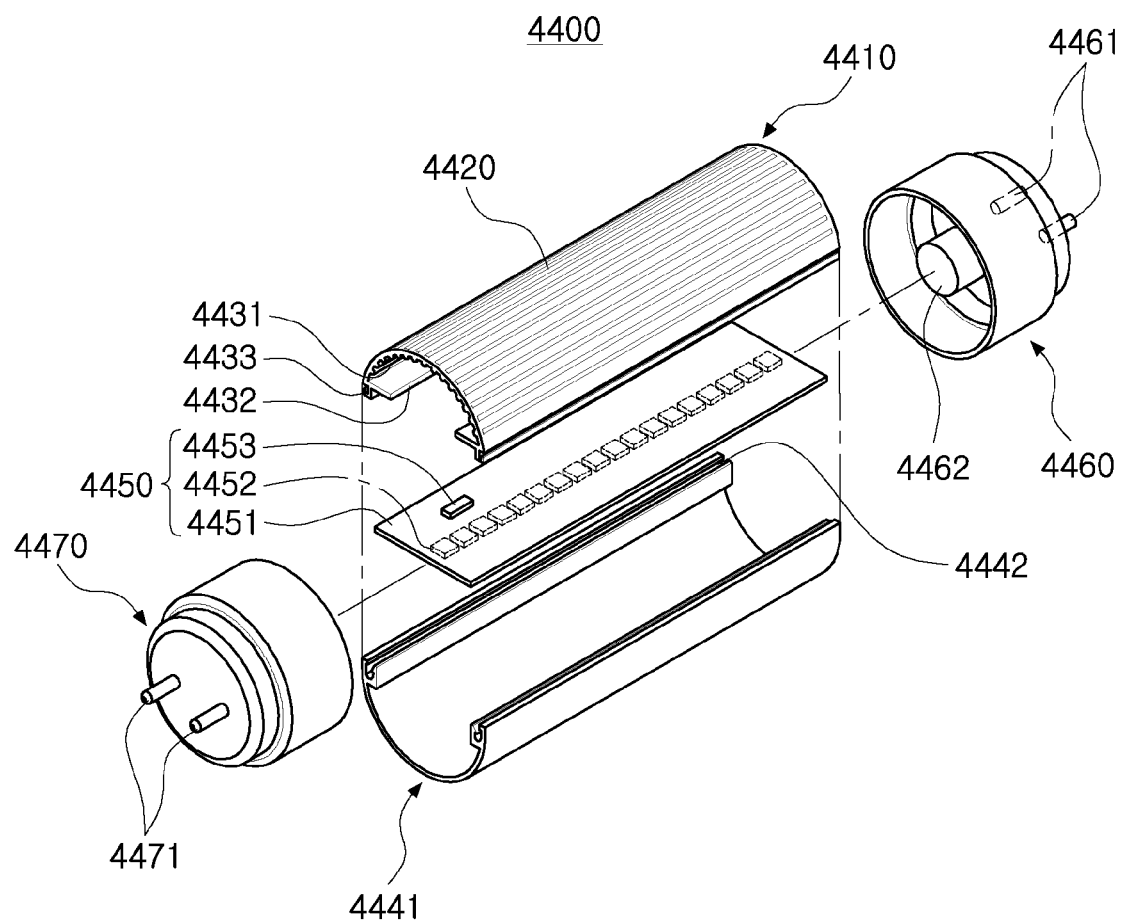
FIG. 13 is an exploded perspective view of a bar-type lamp including a semiconductor package in which a bonding wire for a semiconductor package is employed according to an example embodiment.

FIG. 13 is an exploded perspective view of a bar-type lamp including a semiconductor package in which a bonding wire for a semiconductor package is employed according to an example embodiment.

Referring to FIG. 13, a lighting device 4400 may include a heat sink 4410, a cover 4441, a light source module 4450, a first socket 4460, and a second socket 4470. A plurality of heat sink fins 4420 and 4431 may have an uneven shape on internal and/or external surfaces of the heat sink 4410, and may be designed to have various shapes and intervals. The heat sink 4410 may have protruding supports 4432 formed on an inside thereof. The light source module 4450 may be fixed to the protruding supports 4432. The heat sink 4410 may have protrusions 4433 respectively formed on opposing ends thereof.

The cover 4441 may have grooves 4442 formed therein, and the protrusions 4433 of the heat sink 4410 may be coupled to the grooves 4442 by a hook coupling structure, respectively. Locations of the grooves 4442 and the protrusions 4433 may be changed with each other.

The light source module 4450 may include a light emitting device array. The light source module 4450 may include a PCB 4451, light sources 4452, and a controller 4453. The controller 4453 may store driving information of the light sources 4452. The PCB 4451 may have circuit lines formed thereon to operate the light sources 4452. The PCB 4451 may include components for operating the light sources 4452. Here, the light sources 4452 may be mounted on the PCB 4451 using the bonding wire for the semiconductor package according to an example embodiment.

The first and second sockets 4460 and 4470 may have a structure in which the first and second sockets 4460 and 4470 may be coupled to both ends of a cylindrical cover unit including the heat sink 4410 and the cover 4441 as a pair of sockets. For example, the first socket 4460 may include electrode terminals 4461 and a power supply 4462, and the second socket 4470 may include dummy terminals 4471 disposed thereon. In addition, one of the first and second sockets 4460 and 4470 may have an optical sensor and/or a communications module built therein. For example, the second socket 4470 having the dummy terminals 4471 disposed thereon may have an optical sensor and/or a communications module built therein. Alternatively, the first socket 4460 having the electrode terminals 4461 disposed thereon may have an optical sensor and/or a communications module built therein.

Figure 14:
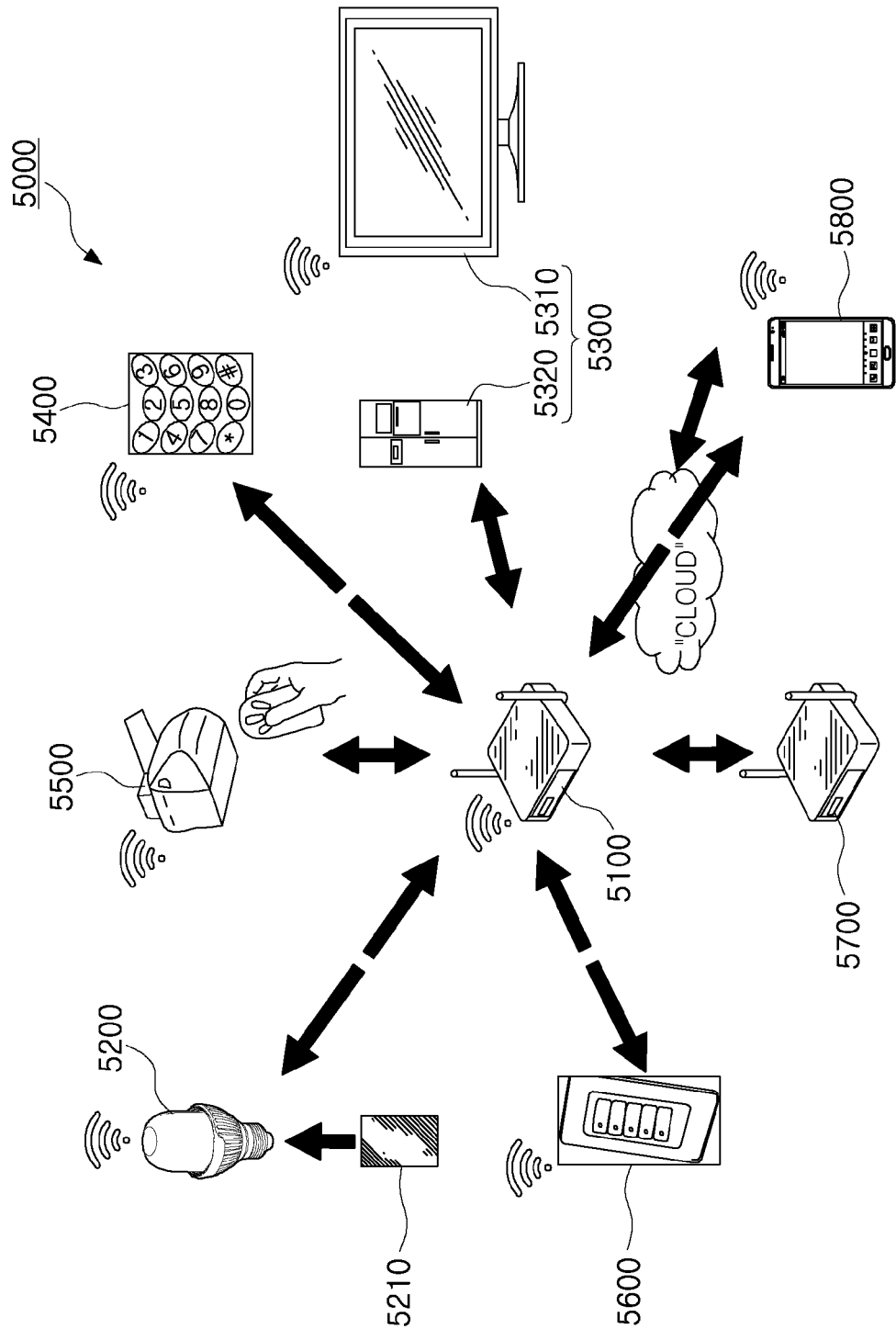
FIG. 14 is a schematic view of an indoor lighting control network system including a semiconductor package in which a bonding wire for a semiconductor package is employed according to an example embodiment.

FIG. 14 is a schematic view of an indoor lighting control network system including a semiconductor package in which a bonding wire for a semiconductor package is employed according to an example embodiment.

Referring to FIG. 14, a network system 5000 according to an example embodiment may be a complex smart lighting-network system in which lighting technology, Internet of Things (IoT) technology, wireless communications technology, and the like using a light emitting device, such as an LED, are combined with each other. The network system 5000 may be implemented by using various types of lighting devices and wired and wireless communications devices, and may be realized by a sensor, a controller, a communications unit, software for network control and maintenance, and the like.

The network system 5000 may be applied to an open space such as a park or a street, as well as a closed space defined within a building, such as a home or an office. The network system 5000 may be implemented on the basis of an IoT environment to collect and process various pieces of information and provide the collected and processed information to a user. In this case, an LED lamp 5200 included in the network system 5000 may function to check and control operational states of other devices 5300 to 5800 included in the IoT environment on the basis of a function of the LED lamp 5200 such as visible light communications, as well as information regarding surroundings received from a gateway 5100 to control lighting of the LED lamp 5200 itself.

Referring to FIG. 14, the network system 5000 may include the gateway 5100 processing data transmitted and received according to different communications protocols, the LED lamp 5200 connected to the gateway 5100 to communicate therewith and including an LED, and the plurality of devices 5300 to 5800 connected to the gateway 5100 to communicate therewith according to various wireless communications methods. To implement the network system 5000 on the basis of the IoT environment, the respective devices 5300 to 5800 and the LED lamp 5200 may include at least one communications module. As an example, the LED lamp 5200 may be connected to the gateway 5100 to communicate therewith by wireless communications protocols such as Wi-Fi, Zigbee®, and light fidelity (Li-Fi). To this end, the LED lamp 5200 may have at least one lamp communications module 5210. Here, the LED lamp 5200 may include LEDs mounted therein using a bonding wire for a semiconductor package according to an example embodiment.

As described above, the network system 5000 may be applied to an open space such as a park or a street, as well as a closed space such as a home or an office. When the network system 5000 is applied to a home, the plurality of devices 5300 to 5800 included in the network system 5000 and connected to the gateway 5100 to communicate therewith on the basis of IoT technology may include home appliances 5300, such as a television 5310 or a refrigerator 5320, a digital door lock 5400, a garage door lock 5500, a lighting switch 5600 installed on a wall or the like, a router 5700 for wireless network relay, and a mobile device 5800, such as a smartphone, a tablet PC, or a laptop PC.

In the network system 5000, the LED lamp 5200 may check the operating states of the various devices 5300 to 5800 or automatically control luminance of the LED lamp 5200 itself according to surroundings and circumstances using wireless communications networks (e.g., Zigbee®, Wi-Fi, Li-Fi, and the like) installed in home. Li-Fi communications using visible light emitted from the LED lamp 5200 may control the devices 5300 to 5800 included in the network system 5000.

First, the LED lamp 5200 may automatically control the luminance of the LED lamp 5200 on the basis of information regarding surroundings transmitted from the gateway 5100 through the lamp communications module 5210, or information regarding circumstances collected by a sensor mounted in the LED lamp 5200. For example, brightness of the LED lamp 5200 may be automatically controlled according to a type of program being broadcasted on the television 5310 or brightness of images. To this end, the LED lamp 5200 may receive operational information of the television 5310 from the lamp communications module 5210 connected to the gateway 5100. The lamp communications module 5210 may be integrally modularized with a sensor and/or a controller included in the LED lamp 5200.

For example, when a program being broadcasted on the television 5310 is a drama, a color temperature of illumination may be controlled to be less than or equal to 12,000K, such as 5,000K, according to predetermined settings to control colors, thereby creating a cozy atmosphere. In a different manner, when a program is a comedy, the network system 5000 may be configured in such a manner that a color temperature of illumination may be increased to 5,000K or more and to be blue-based white lighting according to predetermined settings.

When a certain period of time has elapsed after the digital door lock 5400 is locked while there is no person in a home, all LED lamps 5200 turned on may be turned off, thereby preventing a waste of electricity. Alternatively, when a security mode is set by the mobile device 5800 or the like, if the digital door lock 5400 is locked while there is no person in a home, the LED lamps 5200 may be kept turned on.

Operations of the LED lamp 5200 may be controlled according to information regarding circumstances collected by various types of sensors connected to the network system 5000. For example, when the network system 5000 is implemented within a building, a light, a position sensor, and a communications module may be combined with each other in the building to collect information on locations of people in the building so that the light may be turned on or off, or the collected information may be provided to a user in real time, thereby enabling facility management or efficient use of an idle space. In general, since a lighting device such as the LED lamp 5200 is disposed in almost all of the spaces on each floor of a building, various pieces of information in the building may be collected by a sensor integrated with the LED lamp 5200, and the collected information may be used to manage facilities or utilize an idle space.

Meanwhile, a combination of the LED lamp 5200 with an image sensor, a storage device, the lamp communications module 5210, and the like may allow the LED lamp 5200 to be utilized as a device that may maintain building security or detect and deal with an emergency. For example, when a smoke or temperature sensor is attached to the LED lamp 5200, the LED lamp 5200 may quickly detect whether a fire or the like occurs, thereby significantly reducing damage to the building, and may also control brightness of lighting considering external weather or an amount of sunshine, thereby saving energy and providing a comfortable lighting environment.

As set forth above, according to example embodiments o, there may be provided a bonding wire for a semiconductor package that may secure sulfur resistance, may have reflectivity higher than that of a bonding wire formed of Au with regard to light having a wavelength of 420 nm or more, and may be manufactured at low costs.

While example embodiments have been shown and described above, it will be apparent to those skilled in the art that modifications and variations could be made without departing from the scope of the inventive concept as defined by the appended claims.

What is claimed is:

1. A bonding wire for a semiconductor package comprising:
   a core portion including silver (Ag); and
   a shell layer surrounding the core portion, having a thickness of 23 nm or less, and including gold (Au),
   wherein the bonding wire has a reflectivity higher than a reflectivity of a wire including Au having a purity of 99.99% with regard to light having a wavelength of 420 nm.

2. The bonding wire for the semiconductor package of claim 1, wherein the core portion includes Ag having a purity of 95%, and the shell layer includes Au having a purity of 99% or more.

3. The bonding wire for the semiconductor package of claim 1, wherein the reflectivity of the bonding wire ranges from 38% to 76%.

4. The bonding wire for the semiconductor package of claim 1, wherein the core portion has a thickness of 10 μm to 50 μm.

5. The bonding wire for the semiconductor package of claim 4, wherein the thickness of the shell layer ranges from about 0.0065% to 0.075% of the thickness of the core portion.

6. The bonding wire for the semiconductor package of claim 1, wherein the shell layer has a coating of Au having a thickness of 2 nm to 23 nm formed on a surface of the core portion.

7. A semiconductor package comprising:
   a package body having a first electrode structure and a second electrode structure;
   a semiconductor light emitting device comprising a first electrode portion and a second electrode portion electrically connected to the first electrode structure and the second electrode structure; and a bonding wire connecting at least one of the first electrode structure and the second electrode structure to the semiconductor light emitting device, wherein the bonding wire comprises a core portion including silver (Ag), and a shell layer surrounding the core portion, having a thickness of 2 nm to 23 nm, and including gold (Au), and wherein the bonding wire has a reflectivity higher than a reflectivity of a wire including Au having a purity of 99.99% with regard to light having a wavelength of 420 nm.

8. The semiconductor package of claim 7, wherein at least one of the first electrode portion and the second electrode portion comprises a bonding electrode layer bonded to the bonding wire.

9. The semiconductor package of claim 8, wherein the at least one of the first electrode portion and the second electrode portion further comprises an unevenness electrode layer disposed on the bonding electrode layer, filled with a portion of the bonding wire, and including at least one through hole formed therein to expose an upper surface of the bonding electrode layer.

10. The semiconductor package of claim 9, wherein the at least one through hole is provided in plural, and the at least one through hole has a regular interval and a fixed size.

11. The semiconductor package of claim 9, wherein a cross section of the at least one through hole is cylindrical or polygonal.

12. The semiconductor package of claim 9, wherein the bonding electrode layer contains 70% or more of a material identical to a material of the bonding wire.

13. The semiconductor package of claim 9, wherein the bonding electrode layer further comprises a reflector disposed therebelow.

14. The semiconductor package of claim 9, wherein both the first electrode portion and the second electrode portion comprise the bonding electrode layer and the unevenness electrode layer.

15. The semiconductor package of claim 9, wherein the semiconductor light emitting device comprises a light emitting stack in which a first conductivity-type semiconductor layer, an active layer, and a second conductivity-type semiconductor layer are sequentially stacked.

16. The semiconductor package of claim 15, wherein the semiconductor light emitting device further comprises a current blocking layer disposed between the second conductivity-type semiconductor layer and the bonding electrode layer.

17. The semiconductor package of claim 16, wherein the semiconductor light emitting device further comprises a transparent electrode layer disposed on the second conductivity-type semiconductor layer to cover a region of the current blocking layer.

* * * * *